(12) United States Patent
Yoshiki

(10) Patent No.: US 10,444,919 B2
(45) Date of Patent: Oct. 15, 2019

(54) LIGHT-TRANSMITTING CONDUCTIVE MATERIAL

(71) Applicant: MITSUBISHI PAPER MILLS LIMITED, Tokyo (JP)

(72) Inventor: Takenobu Yoshiki, Tokyo (JP)

(73) Assignee: MITSUBISHI PAPER MILLS LIMITED, Tokyo (JP)

( * ) Notice: Subject to any disclaimer, the term of this patent is extended or adjusted under 35 U.S.C. 154(b) by 0 days.

(21) Appl. No.: 15/740,476

(22) PCT Filed: Jun. 14, 2016

(86) PCT No.: PCT/JP2016/067701
§ 371 (c)(1),
(2) Date: Dec. 28, 2017

(87) PCT Pub. No.: WO2017/002609
PCT Pub. Date: Jan. 5, 2017

(65) Prior Publication Data
US 2018/0196546 A1    Jul. 12, 2018

(30) Foreign Application Priority Data

Jun. 29, 2015  (JP) .................................. 2015-129859

(51) Int. Cl.
*G06F 3/041* (2006.01)
*G06F 3/044* (2006.01)
(Continued)

(52) U.S. Cl.
CPC .............. *G06F 3/044* (2013.01); *H01B 5/14* (2013.01); *G06F 2203/04103* (2013.01);
(Continued)

(58) Field of Classification Search
CPC combination set(s) only.
See application file for complete search history.

(56) References Cited

U.S. PATENT DOCUMENTS

2011/0102370 A1   5/2011  Kono et al.
2014/0144679 A1*  5/2014  Hwang ................... G06F 3/047
                                                    174/255
(Continued)

FOREIGN PATENT DOCUMENTS

CN        104011635 A      8/2014
CN        203882639 U     10/2014
(Continued)

OTHER PUBLICATIONS

International Search Report and Written Opinion dated Aug. 9, 2016, by the Japan Patent Office in corresponding International Patent Application No. PCT/JP2016/067701, with English translation (12 pages).
(Continued)

*Primary Examiner* — Temesghen Ghebretinsae
*Assistant Examiner* — Sosina Abebe
(74) *Attorney, Agent, or Firm* — Osha Liang LLP

(57) ABSTRACT

An optically transparent conductive material including an optically transparent support, sensor parts electrically connected to a terminal area via peripheral wiring parts, and dummy parts not electrically connected to the terminal areas, the sensor parts and the dummy parts being disposed on the optically transparent support, wherein the sensor parts and the dummy parts each have a metal thin wire net-like pattern formed by an assembly of multiple polygons, the metal thin wire pattern of each dummy part includes disconnection parts, and the metal thin wire pattern of each dummy part also includes a region satisfying the following requirement (1) and/or a region satisfying the following requirement (2): (1) each polygon sharing one or more vertices with a polygon having no disconnection part includes at least one disconnection part; and (2) each polygon sharing one or more vertices with at least one of two polygons sharing a (Continued)

side or a vertex and having no disconnection part includes at least one disconnection part.

1 Claim, 14 Drawing Sheets

(51) Int. Cl.
  *H01B 5/14* (2006.01)
  *H05K 1/02* (2006.01)
(52) U.S. Cl.
  CPC .. *G06F 2203/04112* (2013.01); *H05K 1/0274* (2013.01); *H05K 2201/0108* (2013.01)

(56) References Cited

U.S. PATENT DOCUMENTS

| | | |
|---|---|---|
| 2014/0299357 A1 | 10/2014 | Nakamura |
| 2014/0299361 A1 | 10/2014 | Nakamura et al. |
| 2015/0193035 A1* | 7/2015 | Ullmann ................ G06F 3/044 345/173 |
| 2015/0286323 A1 | 10/2015 | Iwami et al. |
| 2015/0309617 A1 | 10/2015 | Yoshiki |
| 2016/0209967 A1* | 7/2016 | Ku ........................ G06F 3/044 |
| 2017/0102804 A1* | 4/2017 | Kikukawa ............. G06F 3/041 |

FOREIGN PATENT DOCUMENTS

| | | |
|---|---|---|
| JP | 2003-077350 A | 3/2003 |
| JP | 2005-250169 A | 9/2005 |
| JP | 2006-344163 A | 12/2006 |
| JP | 2007-188655 A | 7/2007 |
| JP | 2007-287953 A | 11/2007 |
| JP | 2007-287994 A | 11/2007 |
| JP | 2010-262529 A | 11/2010 |
| JP | 2012-146277 A | 8/2012 |
| JP | 2013-030378 A | 2/2013 |
| JP | 2013-143045 A | 7/2013 |
| JP | 2014-109997 A | 6/2014 |
| JP | 2014-127115 A | 7/2014 |
| JP | 2014-186716 A | 10/2014 |
| TW | 201013488 A | 4/2010 |
| TW | 201327317 A | 7/2013 |
| TW | 201432540 A | 8/2014 |
| TW | 201435923 A | 9/2014 |

OTHER PUBLICATIONS

International Preliminary Report on Patentability dated Jan. 2, 2018, by the International Bureau of WIPO in corresponding International Patent Application No. PCT/JP2016/067701, with English translation (9 pages).
Office Action issued in Japanese Application No. 2016-122591, dated Apr. 2, 2019 (6 pages).

* cited by examiner 11-a 11-b

LIGHT-TRANSMITTING CONDUCTIVE MATERIAL

TECHNICAL FIELD

The present invention relates to an optically transparent conductive material for touchscreens, organic EL materials, solar cells, and the like. More specifically, the present invention relates to an optically transparent conductive material suitable for projected capacitive touchscreens.

BACKGROUND ART

Touchscreens are widely used as input means on displays of smart devices such as personal digital assistants (PDAs), laptop computers, smartphones, and tablet computers, as well as other electronic devices such as office automation equipment, medical equipment, and car navigation systems.

There are various touchscreens that utilize different position detection methods, such as optical, ultrasonic, surface capacitive, projected capacitive, and resistive, touchscreens. Resistive touchscreens include an optically transparent conductive material and a glass plate with an optically transparent conductive layer, which face each other with a spacer therebetween. An electrical current is applied to the optically transparent conductive material, and the voltage of the glass plate with an optically transparent conductive layer is measured. In contrast, capacitive touchscreens basically include an optically transparent support and an optically transparent conductive layer thereon and do not include movable parts. The capacitive touchscreens have high durability and high optical transmittance, and are thus used in various applications. Projected capacitive touchscreens are also capable of simultaneous multipoint detection, and are thus widely used in devices such as smartphones and tablet PCs.

Conventional transparent electrodes (optically transparent conductive materials) for touchscreens usually include an ITO (indium-tin oxide) conductive film as an optically transparent conductive layer formed on an optically transparent support. Yet, ITO conductive films have a high refractive index and high surface reflectivity, so that optically transparent conductive materials including an ITO conductive film unfortunately have a reduced total light transmittance. In addition, due to low flexibility, such ITO conductive films are prone to crack when bent, resulting in an increased electrical resistance.

As an alternative optically transparent conductive material including an optically transparent conductive layer different from an ITO conductive film, Patent Literature 1 and Patent Literature 2, for example, each disclose an optically transparent conductive material having a metal thin wire net-like pattern on an optically transparent support, which can be obtained by a method (semi-additive method) in which a thin catalytic layer is formed on a optically transparent support, a pattern is formed thereon using a resist, a metal layer is stacked on resist opening portions by plating, and lastly, the resist layer and a underlayer metal protected by the resist layer are removed.

Recent proposals also include a method that uses a silver halide photosensitive material produced by a silver salt diffusion transfer process as a conductive-material precursor to produce a metal thin wire net-like pattern. For example, Patent Literature 3, Patent Literature 4, and Patent Literature 5 each disclose a technique for forming a metal (silver) thin wire pattern by reacting a conductive-material precursor with a soluble silver halide forming agent and a reducing agent in an alkaline fluid, wherein the conductive-material precursor includes at least a physical development nucleus layer and a silver halide emulsion layer formed in this order on an optically transparent support. A metal thin wire pattern produced by this method can reproduce uniform wire width, and can also provide high conductivity with a narrower wire width compared to patterns produced by other methods because silver has the highest conductivity of all metals. The optically transparent conductive layer obtained by this method is also advantageous in that it has higher flexibility and higher bending resistance than ITO conductive films.

Projected capacitive touchscreens include a touch sensor formed of an optically transparent conductive material on which multiple sensor parts are patterned on the same plane. If such a touch sensor is formed of an optically transparent conductive material only having multiple sensor parts, the sensor parts will be noticeable. Thus, usually, dummy parts that are non-conductive with the sensor parts are arranged at portions where the sensor parts are not patterned on the optically transparent conductive material. For example, Patent Literature 6 suggests a method for disposing sensor parts and dummy parts by dividing a metal thin wire pattern by slits. Patent Literature 7 discloses an optically transparent conductive material in which disconnection parts are provided within a metal thin wire pattern to cut off conduction from sensor parts so as to form dummy parts and in which the difference in aperture ratio between the sensor parts and the dummy parts is specified. Patent Literature 8 suggests a method in which a metal thin wire net-like pattern of sensor parts and a metal thin wire net-like pattern of dummy parts are shifted along the boundary between each sensor part and each dummy part so as to cut off conduction of the dummy parts from the sensor parts. Patent Literature 9 discloses dummy parts formed in a metal thin wire net-like pattern formed by an assembly of multiple polygons each including a disconnection part. Patent Literature 10 suggests a method for providing floating electrodes (dummy parts) separated from sensor parts via disconnection parts.

CITATION LIST

Patent Literature

Patent Literature 1: JP-A 2007-287994
Patent Literature 2: JP-A 2007-287953
Patent Literature 3: JP-A 2003-77350
Patent Literature 4: JP-A 2005-250169
Patent Literature 5: JP-A 2007-188655
Patent Literature 6: JP-A 2006-344163
Patent Literature 7: JP-A 2013-30378
Patent Literature 8: JP-A 2014-127115
Patent Literature 9: JP-A 2014-186716
Patent Literature 10: JP-A 2014-109997

SUMMARY OF INVENTION

Technical Problem

Optically transparent conductive materials having a metal thin wire net-like pattern are required to ensure the invisibility of the shapes of the sensor parts and the dummy parts (i.e., the pattern is difficult to see) and also to minimize the occurrence of short circuit during production of the optically transparent conductive materials. It is possible to prevent short circuit by sufficiently increasing the width of each disconnection part (the length of the disconnected portion) provided in the metal thin wire pattern of the dummy parts; however, the disconnection parts having a sufficiently increased width sometimes result in a phenomenon, so-called "visible pattern or pattern visibility", where the shapes of the sensor parts and the dummy parts patterned on the optically transparent support are recognizable. Since an aim to reduce the occurrence of short circuit during production of the optically transparent conductive materials conflicts with an aim to reduce pattern visibility, it has been very difficult to achieve both aims at the same time.

In a projected capacitive touchscreen, usually, two sheets of an optically transparent conductive material having multiple sensor parts patterned on the same plane are superimposed on each other, and a portion where the upper and lower sensor parts overlap each other serves as a capacitor. Changes in the capacitance of the capacitor upon touch by a user are captured by the sensors which thus operate as touch sensors. A capacitor having a smaller capacitance is preferred for increasing the sensitivity of the sensor.

Generally, the capacitance of the capacitor is known to be proportional to the area of polar plates (the portion where the upper and lower sensor parts overlap each other) and inversely proportional to the distance between the polar plates. Further, when a conductor is located close to the capacitor, the capacitance of the capacitor may change due to the influence of the conductor. Such a change is known as parasitic capacitance.

As disclosed in Patent Literatures 6 to 10, in an optically transparent conductive material having a metal thin wire net-like pattern, a dummy part also has a metal thin wire pattern which is a conductor. In the case of a projected capacitive touchscreen, since a metal thin wire pattern including disconnection parts (i.e., dummy parts) is located close to the portion where upper and lower sensor parts overlap each other, the parasitic capacitance occurs due to the dummy parts, causing a reduction in the sensitivity of the touchscreen.

An object of the present invention is to provide an optically transparent conductive material capable of producing a highly sensitive touchscreen, in which the pattern visibility and the occurrence of short circuit are reduced.

Solution to Problem

The object of the present invention is achieved by the invention described below.

The present invention provides an optically transparent conductive material including an optically transparent support, sensor parts electrically connected to terminal areas via peripheral wiring parts, and dummy parts not electrically connected to the terminal areas, the sensor parts and the dummy parts being disposed on the optically transparent support, wherein the sensor parts and the dummy parts each have a metal thin wire net-like pattern formed by an assembly of multiple polygons, the metal thin wire pattern of each dummy part includes disconnection parts, and the metal thin wire pattern of each dummy part also includes a region satisfying the following requirement (1) and/or a region satisfying the following requirement (2):

(1) each polygon sharing one or more vertices with a polygon having no disconnection part includes at least one disconnection part; and
(2) each polygon sharing one or more vertices with at least one of two polygons sharing a side or a vertex and having no disconnection part includes at least one disconnection part.

Advantageous Effects of Invention

The present invention provides a highly sensitive optically transparent conductive material in which the pattern visibility and the occurrence of short circuit are reduced.

DESCRIPTION OF EMBODIMENTS

The present invention is described in detail below with reference to the drawings.

Figure 1:
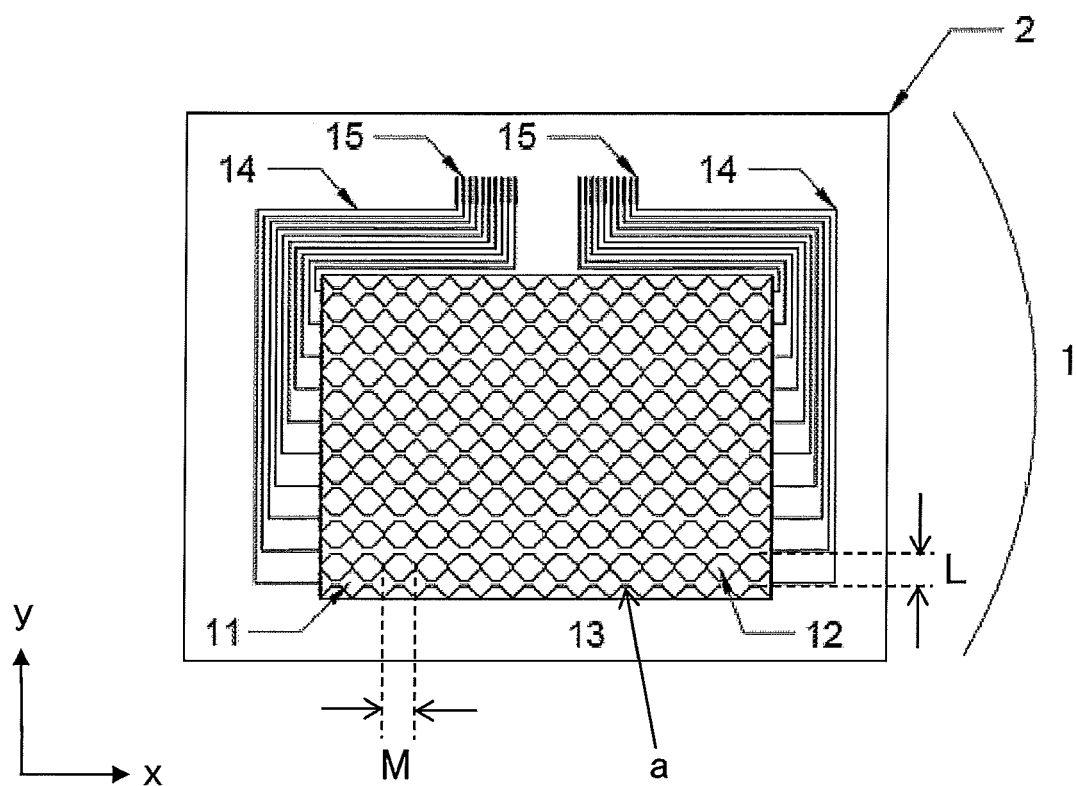
FIG. 1 is a schematic view of an exemplary optically transparent conductive material of the present invention.

FIG. 1 is a schematic view of an exemplary optically transparent conductive material of the present invention. In FIG. 1, an optically transparent conductive material 1 of the present invention includes an optically transparent support 2 and the following elements thereon: terminal areas 15, peripheral wiring parts 14, sensor parts 11 having a metal thin wire net-like pattern formed by an assembly of multiple polygons, and dummy parts 12 having a metal thin wire net-like pattern formed by an assembly of multiple polygons and also having disconnection parts in the metal thin wire pattern. The sensor parts 11 are electrically connected to the terminal areas 15 via the peripheral wiring parts 14. As the sensor parts 11 are electrically connected to the outside via the terminal areas 15, changes in the capacitance sensed by the sensor parts 11 can be captured. In contrast, the dummy parts 12 are not electrically connected to the terminal areas 15. In FIG. 1, the region of each sensor part 11 and the region of each dummy part 12 are each represented by an imaginary boundary line a (although the sensor parts 11 and the dummy parts 12 are shown with no pattern, these parts each actually have a metal thin wire pattern). Further, the optically transparent conductive material of the present invention can also include non-image parts 13 without a metal pattern and ground wire parts (not shown) not electrically connected to the sensor parts 11.

The sensor parts 11 and the dummy parts 12 in FIG. 1 each have a metal thin wire net-like pattern formed by an assembly of multiple polygons. The width of the metal thin wire in the pattern is preferably 20 μm or less, more preferably 1 to 15 μm, still more preferably 2 to 10 μm. Preferably, the sensor parts 11 and the dummy parts 12 each have an aperture ratio (the ratio of the area occupied by portions without metal thin wires to the area occupied by the sensor parts 11 or the dummy parts 12) of 86% or higher, more preferably 95 to 98%. The metal thin wire patterns constituting the sensor parts 11 and the dummy parts 12 are each a metal thin wire net-like pattern formed by an assembly of multiple polygons. Examples of polygons include triangles such as equilateral triangles, isosceles triangles, and right triangles; quadrangles such as squares, rectangles, parallelograms, trapezoids, and rhombuses; (regular) n-gons such as (regular) hexagons, (regular) octagons, (regular) dodecagons, and (regular) icosagons; star shapes; and combinations of these shapes. The sides of the polygons do not have to be straight lines and may be zigzag lines, wavy lines, or curves.

In the present invention, the sensor parts 11 and the dummy parts 12 are each formed in a metal thin wire net-like pattern formed by an assembly of multiple polygons. The metal thin wire pattern may be a regular pattern or a random pattern.

In the present invention, the term "regular pattern" means that there is regularity in how polygons are assembled. Examples include a pattern in which polygons of the same shape and size are regularly assembled, and a pattern in which polygons of several different shapes and sizes are assembled while regularity is maintained. In contrast, in the present invention, the term "random pattern" refers to a pattern without regularity in the shape of polygons assembled or in the repetition in how the polygons are assembled. It should be noted that the design of the optically transparent conductive material including the sensor parts 11 and the dummy parts 12 will be very complicated if there is no regularity in the shape of polygons assembled or in the repetition in how the polygons are assembled in the entire region of the sensor parts 11 and the dummy parts 12. Thus, if a pattern has no regularity in the shape of polygons or in the repetition in how the polygons are assembled in an at least 10-mm$^2$ region, such a metal thin wire net-like pattern is regarded as a random pattern.

When the sensor parts 11 and the dummy parts 12 are each formed in a regular pattern, the smallest unit of a repeated regular shape is referred to as a "unit figure". Unit figures of the sensor parts 11 and the dummy parts 12 may have the same shape or different shapes; however, unit figures of the same shape are preferred in terms of reducing "pattern visibility". Preferably, such unit figures also have the same size. Yet, differences in the presence or absence of a disconnection part, location of the disconnection part, width of the disconnection part, and the like should not be considered in determining whether or not the unit figures have the same shape. In the case of employing the present invention to produce the optically transparent conductive material for a versatile touchscreen capable of preventing moire even when used in different kinds of liquid crystal display (LCD) panels, the sensor parts 11 and the dummy parts 12 each preferably have a net-like shape of a random pattern. In contrast, in the case of producing the optically transparent conductive material for a touchscreen exclusive for a specific LCD or for the purpose of preventing a "grainy appearance" problem peculiar to the use of a random pattern, the sensor parts 11 and the dummy parts 12 each preferably have a net-like shape of a regular pattern.

In the present invention, when the sensor parts 11 and the dummy parts 12 each have a regular net-like pattern, a preferred shape of the unit figure is a square or a rhombus in terms of preventing a moire phenomenon that occurs in relation to a liquid crystal display. A rhombus in which one vertex has an angle of 30 to 80° is more preferred.

There is a case where the sensor parts 11 or the dummy parts 12 are disposed on the optically transparent support 2 and these parts are arranged with a certain period (for example, in FIG. 1, the sensor parts 11 and the dummy parts 12 are arranged with a period L in a y-direction). In such a case, preferably, the unit figures are arranged with a period Py in the y-direction, the period Py being an integral fraction of twice the length of the period L (Py=2L/N, where N is any natural number). In addition, there is a case where the shapes of the sensor parts 11 or the dummy parts 12 are arranged with a certain period (period M in FIG. 1) in their extending direction (x-direction in FIG. 1), or there is a case where another optically transparent conductive material as a counterpart is involved in the production of a projected capacitive touchscreen and the sensor parts 11 and/or the dummy parts 12 on this optically transparent conductive material are arranged with a certain period (not shown) in their extending direction. In such a case, in contrast to the certain period, the unit figures are preferably arranged with a period Px in the extending direction of the sensor parts 11 and the dummy parts 12 (x-direction in FIG. 1), the period Px being an integral fraction of twice the length of the period (M in FIG. 1) (Px=2M/O, where O is any natural number). This arrangement can provide an optically transparent conductive material suitable to provide a touch sensor having uniform sensitivity.

In the present invention, in the case where a net-like shape of a random pattern is employed, the random pattern may be a Voronoi diagram or a Delaunay diagram, or a pattern obtained by expanding or reducing such a random pattern in any direction. Essentially, these random patterns have no periodicity. Yet, in the present invention, as described above, if a pattern does not maintain regularity in an at least 10-mm$^2$ region, such a pattern is regarded as a random pattern. Thus, it is possible to form a random pattern by, for example, defining a 16-mm$^2$ region as a base figure and repeating this base figure. As for the period of the base figure, there is a case where the sensor parts 11 or the dummy part 12 are arranged with a certain period in their alignment direction (for example, in FIG. 1, the sensor parts 11 and the dummy parts 12 are arranged with the period L in the y-direction). In such a case, preferably, the base figures are arranged with a period (By) in the y-direction, the period (By) being an integral multiple of the period L (By=QL, where Q is any natural number) or an integral fraction of twice the length of the period L (By=2L/S, where S is any natural number). In addition, there is a case where the shapes of the sensor parts 11 or the dummy parts 12 are arranged with a certain period (period M in FIG. 1) in their extending direction (x-direction in FIG. 1), or there is a case where another optically transparent conductive material as a counterpart is involved in the production of a projected capacitive touchscreen and the sensor parts 11 and/or the dummy parts 12 on this optically transparent conductive material are arranged with a certain period (not shown) in their extending direction. In such a case, in contrast to the certain period, the base figures are preferably arranged with a period Bx in the extending direction of the sensor parts 11 and the dummy parts 12 (x-direction in FIG. 1), the period Bx being an integral multiple of the period (for example, M in FIG. 1) (Bx=RM, where R is any natural number) or an integral fraction of twice the length of the period (for example, M in FIG. 1) (Bx=2M/T, where T is any natural number). This arrangement can reduce the "grainy appearance" problem peculiar to the use of a random pattern.

Further, in the present invention, in the case where a random pattern or a base figure obtained by expanding or reducing a random pattern in any direction is repeated, preferably, the sensor parts 11 and the dummy parts 12 are formed with different base figures. In addition, in this case, it is preferred that the period of the sensor parts 11 in the x-direction or y-direction is shorter than the period of the dummy parts 12 in the x-direction or y-direction, and it is more preferred that the period of the sensor part 11 is shorter than the period of the dummy part 12 in both the x-direction and the y-direction. This arrangement can further reduce the "grainy appearance".

In the present invention, the metal thin wire pattern of each dummy part 12 includes disconnection parts. Each disconnection part may be provided by making a cut in a part of the metal thin wire pattern. Alternatively, for example, a method disclosed in Patent Literature 8 may be employed in which the net-like shape is shifted in a specific direction along the boundary line. In order to reduce the difference in the aperture ratio (the ratio of the area occupied by portions without metal thin wires to the area occupied by the sensor parts 11 or the dummy parts 12) between the sensor parts 11 and the dummy parts 12 resulting from the presence of the disconnection parts, the metal thin wire pattern of the dummy parts 12 may have a greater wire width than that of the sensor parts 11, or the metal thin wire pattern of the dummy parts 12 may partly have a greater wire width. If the width of each disconnection part is too wide, the aperture ratio difference between the sensor parts 11 and the dummy parts 12 will be large, and the difference between the dummy parts 12 and the sensor parts 11 will be easily visible. In contrast, if the width of each disconnection part is too narrow, a connection may be established at a part that should be a disconnection part (which results in a short circuit) due to production defects. Thus, the width of the disconnection part (length of the disconnection) is preferably 1 to 20 μm, more preferably 2 to 10 μm. The disconnection part may be provided on a side or a vertex of a polygon. Yet, preferably, the disconnection part is provided on a side of a polygon in order to cut off the electrical connection without fail.

In the present invention, the metal thin wire pattern of each dummy part includes a region satisfying the following requirement (1) and/or a region satisfying the following requirement (2):

(1) each polygon sharing one or more vertices with a polygon having no disconnection part includes at least one disconnection part; and
(2) each polygon sharing one or more vertices with at least one of two polygons sharing a side or a vertex and having no disconnection part includes at least one disconnection part.

Figure 2:
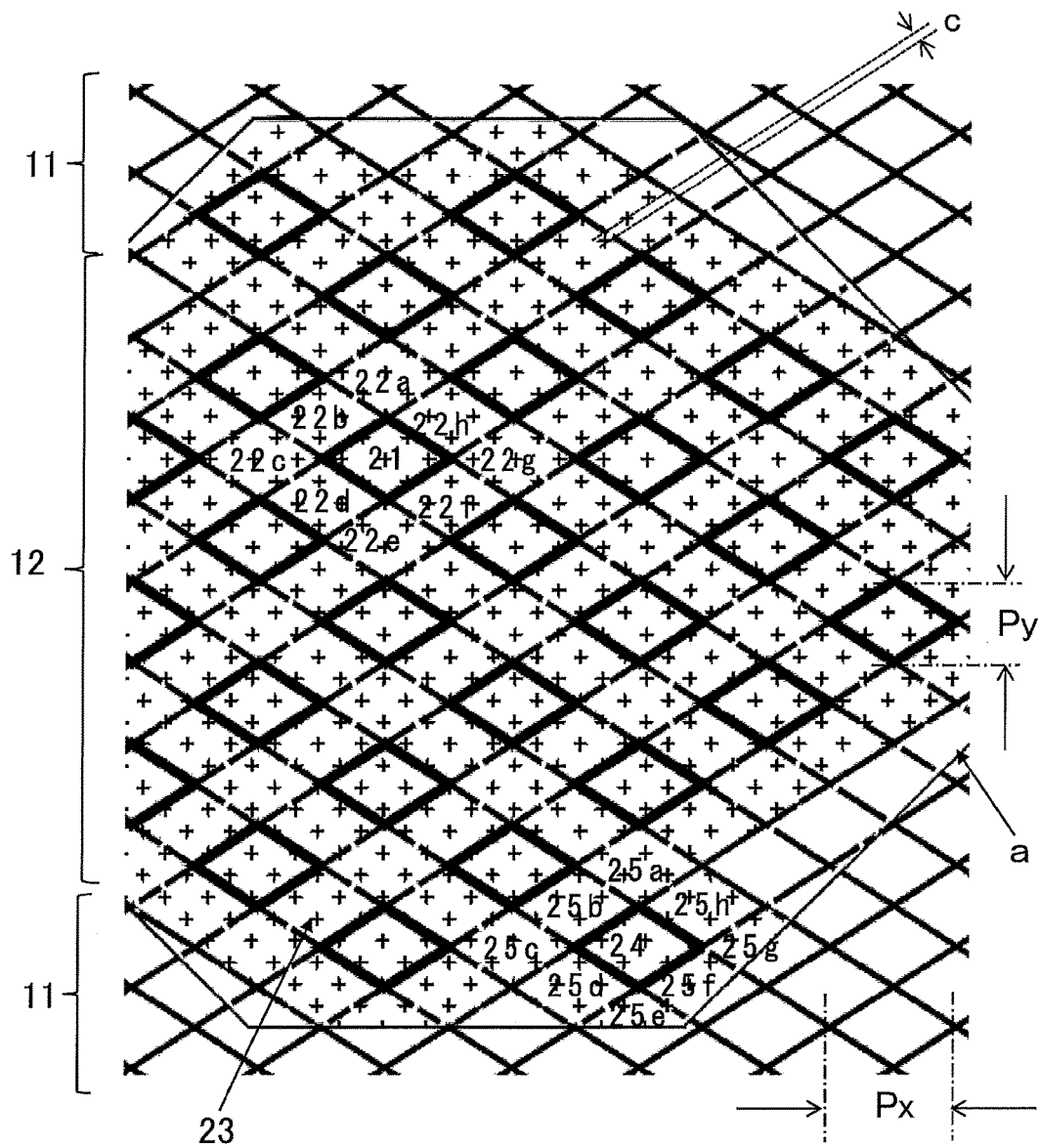
FIG. 2 is a schematic expanded view of an exemplary optically transparent conductive material of the present invention.

The requirement (1) is described with reference to FIG. 2. FIG. 2 is a schematic expanded view of an exemplary optically transparent conductive material of the present invention, in which the sensor parts 11 and the dummy parts 12 in FIG. 1 are partly enlarged. In FIG. 2, the sensor part 11 and the dummy part 12 each have a metal thin wire net-like pattern formed by an assembly of rhombus-shaped unit figures (for example, a rhombus 21, rhombuses 22a to 22h, and a rhombus 24). In FIG. 2, the thick-lined rhombus 21 has no disconnection part (thick lines are used for the sake of description; the actual metal thin wires are not thick). In contrast, each of the eight rhombuses 22a to 22h sharing one or more vertices with the rhombus 21 has at least one disconnection part. For example, the rhombus 22a has four disconnection parts, and the rhombus 22b has two disconnection parts. Each disconnection part is provided by making a cut for a distance c in the metal thin wire pattern, on the sides of the rhombuses 22a to 22h. In FIG. 2, the region satisfying the requirement (1) in the dummy part 12 is shown as a region 23. The portion shaded with "+" in FIG. 2 corresponds to the region 23. In the present invention, the area of the region satisfying the requirement (1) preferably accounts for 50% or more of the area of the dummy part 12. This arrangement can provide an optically transparent conductive material in which the pattern visibility and the occurrence of short circuit are significantly reduced. In the case where a unit figure satisfying the requirement (1) is present on the boundary (on the imaginary boundary line a) between the sensor part 11 and the dummy part 12 (for example, in FIG. 2, the rhombus 24 having no disconnection part is surrounded by rhombuses 25a to 25h each sharing one or more vertices with the rhombus 24, and these rhombuses such as the rhombus 25e, the rhombus 25f, and the rhombus 25g overlie the imaginary boundary line a), the region satisfying the requirement (1) is calculated including only the areas of portions of the rhombus 25e, the rhombus 25f, and the rhombus 25g which are located in the dummy part 12 and excluding the areas of portions of the rhombus 25e, the rhombus 25f, and the rhombus 25g which are located in the sensor part 11.

As shown in FIG. 2, the area of the region 23 satisfying the requirement (1) includes the areas of polygons having no disconnection part (i.e., the rhombuses 21 and 24 in FIG. 2), which serve as the base for the determination of the requirement (1).

Next, the requirement (2) is described with reference to FIG. 3.

Figure 3:
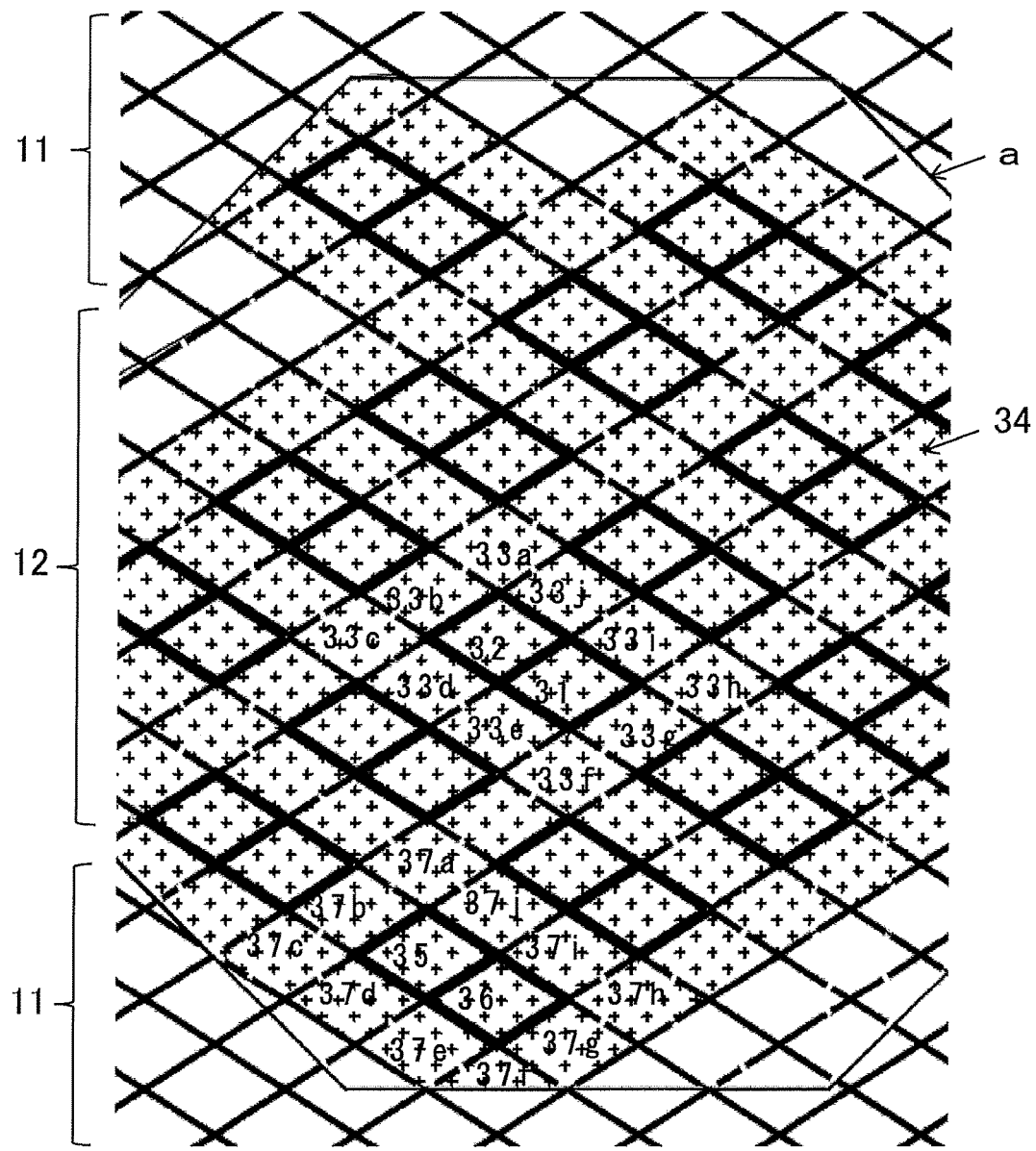
FIG. 3 is a schematic expanded view of another exemplary optically transparent conductive material of the present invention.

FIG. 3 is a schematic view of another exemplary optically transparent conductive material of the present invention, in which the sensor parts 11 and the dummy parts 12 in FIG. 1 are partially enlarged. In FIG. 3, the sensor part 11 and the dummy part 12 each have a metal thin wire net-like pattern formed by an assembly of rhombus-shaped unit figures (for example, a rhombus 31, rhombuses 33a to 33j, and a rhombus 36). In FIG. 3, the thick-lined rhombus 31 and a thick-lined rhombus 32 share a side (thick lines are used for the sake of description; the actual metal thin wires are not thick). The rhombus 31 and the rhombus 32 sharing a side have no disconnection part, and each of the rhombuses 33a to 33j sharing one or more vertices with the rhombus 31 and/or the rhombus 32 has at least one disconnection part. For example, the rhombus 33a has four disconnection parts, and the rhombus 33b has two disconnection parts. In FIG. 3, a region satisfying the requirement (2) in the dummy part 12 is shown as a region 34. The portion shaded with "+" in FIG. 3 corresponds to the region 34. In the present invention, the area of the region satisfying the requirement (2) preferably accounts for 50% or more of the area of the dummy part 12. As is the case with the requirement (1), this arrangement can provide an optically transparent conductive material in which the pattern visibility and the occurrence of short circuit are particularly reduced. In the case where a unit figure satisfying the requirement (2) is present on the boundary (on the imaginary boundary line a) between the sensor part 11 and the dummy part 12 (for example, in FIG.

3, the rhombuses 35 and 36 sharing a side and having no disconnection part are surrounded by rhombuses 37a to 37j each sharing one or more vertices with the rhombus 35 and/or rhombus 36, and for example, the rhombus 37f overlies the imaginary boundary line a), the region satisfying the requirement (2) is calculated including only the area of a portion of the rhombus 37f which is located inside the dummy part 12 and excluding the area of a portion of the rhombus 37f which is located in the sensor part 11.

As shown in the region 34 shaded with "+" in FIG. 3, the area of the region satisfying the requirement (2) includes the areas of every two polygons sharing a side and having no disconnection part (such as the rhombuses 31 and 32, and the rhombuses 35 and 36), which serve as the base for the determination of the requirement (2).

Further, the requirement (2) is described with reference to FIG. 13.

Figure 13:
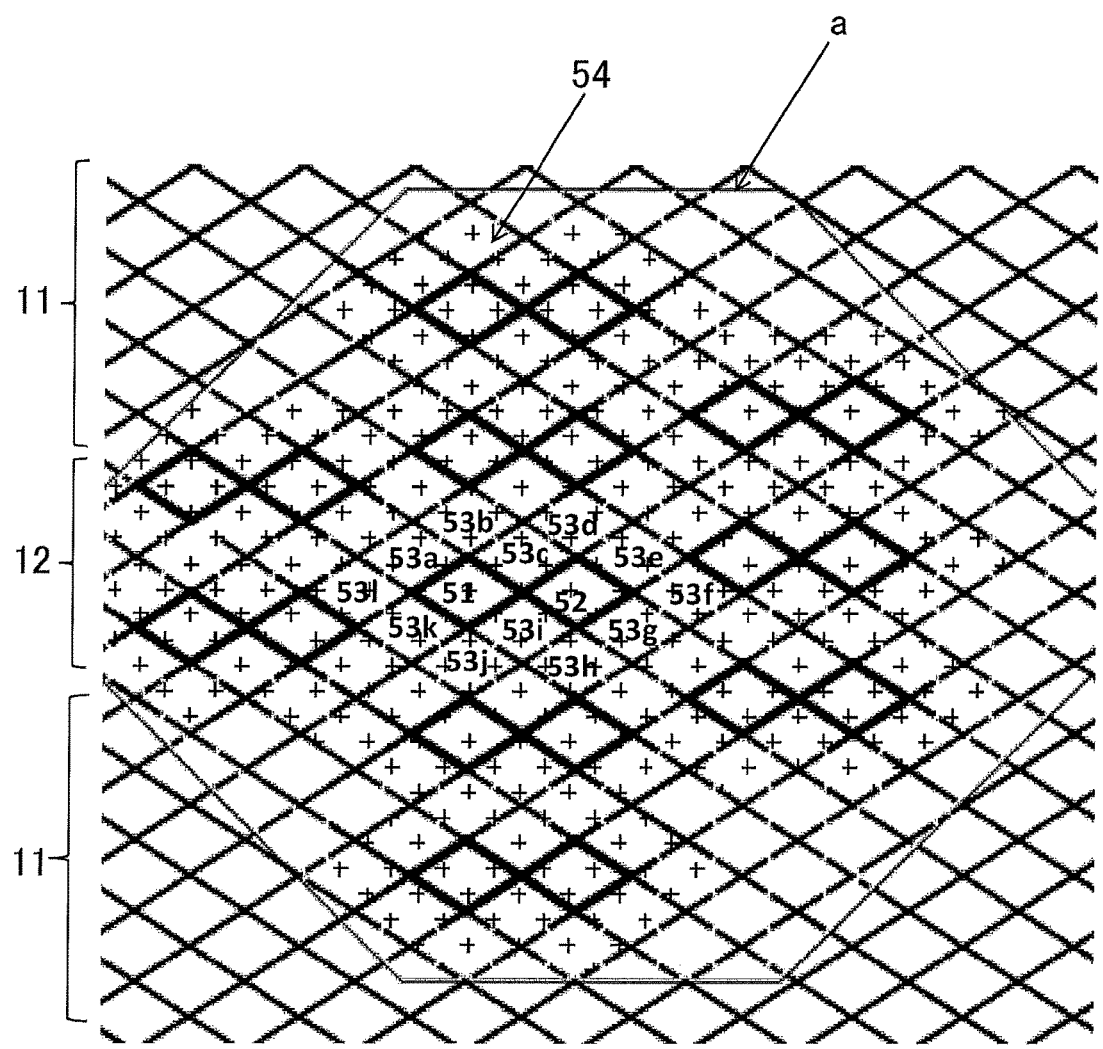
FIG. 13 is a schematic expanded view of yet another exemplary optically transparent conductive material of the present invention.

FIG. 13 is a schematic expanded view of yet another exemplary optically transparent conductive material of the present invention, in which the sensor parts 11 and the dummy parts 12 in FIG. 1 are partly enlarged. In FIG. 13, the sensor part 11 and the dummy part 12 each have a metal thin wire net-like pattern formed by an assembly of rhombus-shaped unit figures (for example, a rhombus 51, a rhombus 52, and rhombuses 53a to 53l). In FIG. 13, the thick-lined rhombus 51 and the thick-lined rhombus 52 share a vertex (thick lines are used for the sake of description; the actual metal thin wires are not thick). The rhombus 51 and the rhombus 52 sharing a vertex have no disconnection part, and each of the rhombuses 53a to 53l sharing one or more vertices with the rhombus 51 and/or the rhombus 52 has at least one disconnection part. For example, the rhombus 53a has three disconnection parts, the rhombus 53b has four disconnection parts, and the rhombus 53c has two disconnection parts. In FIG. 13, the region satisfying the requirement (2) in the dummy part 12 is shown as a region 54. The portion shaded with "+" in FIG. 13 corresponds to the region 54.

As shown in the region 54 shaded with "+" in FIG. 13, the area of the region satisfying the requirement (2) includes the areas of every two polygons sharing a vertex and having no disconnection part (such as the rhombuses 51 and 52), which serve as the base for the determination of the requirement (2).

The dummy part of the optically transparent conductive material of the present invention may include both the region satisfying the requirement (1) and the region satisfying the requirement (2). The percentage of the total area of the region satisfying the requirement (1) and the region satisfying the requirement (2) (hereinafter also referred to as the percentage of the region(s) satisfying the requirement (1) and/or the requirement (2)) in the area of the dummy part is preferably 50% or higher. In the calculation of the total area, in the case where the region satisfying the requirement (1) and the region satisfying the requirement (2) overlap each other, the overlapped region is assumed to be either one of the region satisfying the requirement (1) or the region satisfying the requirement (2) for calculation. The area of the overlapped region should not be duplicated in the calculation.

In the present invention, the sensor parts 11, the dummy parts 12, the peripheral wiring parts 14, and the terminal areas 15 are preferably made of metal, particularly preferably gold, silver, copper, nickel, aluminium, or composite materials thereof. Examples of the method for forming the sensor parts 11, the dummy parts 12, the peripheral wiring parts 14, and the terminal areas 15 include known methods such as a method in which a silver halide photosensitive material is used; a method in which a silver halide photosensitive material is used and an obtained silver image is electroless plated or electroplated; a method in which conductive ink such as silver paste or copper paste is printed by a screen printing method; a method in which conductive ink such as silver ink or copper ink is printed by an ink-jet method; a method in which a conductive layer is formed by vapor deposition or sputtering, and a resistance film is formed thereon, followed by exposure, development, etching, and resist layer removal; and a method in which metal foil such as copper foil is attached, and a resistance film is formed thereon, followed by exposure, development, etching, and resist layer removal. Particularly preferred is the silver salt diffusion transfer process capable of making a thin pattern made of metal and also capable of easily forming a very fine pattern. A pattern that is too thick may be difficult to be post-processed. A pattern that is too thin may not be able to provide necessary conductivity as a touchscreen. Thus, the thickness of a pattern made of metal is preferably 0.01 to 5 μm, more preferably 0.05 to 1 μm. In the optically transparent conductive material of the present invention, the sensor parts 11, the dummy parts 12, the peripheral wiring parts 14, and the terminal areas 15 may be provided either one side or both sides of the optically transparent support. The silver salt diffusion transfer process is described in detail in documents such as Patent Literature 3, Patent Literature 4, and Patent Literature 5.

The optically transparent support of the optically transparent conductive material of the present invention is preferably a plastic, glass, rubber, or ceramic support, for example. Such an optically transparent support preferably has a total light transmittance of 60% or higher. The plastic support is particularly preferably a flexible resin film because of its excellent handling properties. Specific examples of the resin film used as the optically transparent support include resin films made of polyester resin such as polyethylene terephthalate (PET) and polyethylene naphthalate (PEN), acrylic resin, epoxy resin, fluororesin, silicone resin, polycarbonate resin, diacetate resin, triacetate resin, polyarylate resin, polyvinyl chloride, polysulfone resin, polyether sulfone resin, polyimide resin, polyamide resin, polyolefin resin, and cyclic polyolefin resin, having a thickness of 50 to 300 μm. The optically transparent support may be provided with a known layer such as an easy-adhesion layer.

The optically transparent conductive material of the present invention may include, in addition to the optically transparent support, easy-adhesion layer, and optically transparent conductive layer including the sensor parts and the dummy parts each formed in a metal thin wire pattern described above, a known layer such as a hard coat layer, an antireflection layer, an adhesive layer, or an antiglare layer between the optically transparent support and the optically transparent conductive layer, on the side of the optically transparent support on which the optically transparent conductive layer is not present, or on the optically transparent conductive layer. A physical development nuclei layer or the like may also be provided between the optically transparent support and the optically transparent conductive layer.

EXAMPLES

The present invention is described in detail below with reference to examples, but the present invention is not limited to the following embodiments within the scope of the invention.

<Production of Optically Transparent Conductive Material 1>

A 100-μm thick polyethylene terephthalate film was used as an optically transparent support. The total light transmittance of the optically transparent support was 91%.

Next, in accordance with the following formulation, the following physical development nuclei coating liquid was prepared, applied to the optically transparent support, and dried to form a physical development nuclei layer.

<Preparation of Palladium Sulfide Sol>

| Liquid A: | |
| --- | --- |
| Palladium chloride | 5 g |
| Hydrochloric acid | 40 ml |
| Distilled water | 1000 ml |
| Liquid B: | |
| Sodium sulfide | 8.6 g |
| Distilled water | 1000 ml |

Liquid A and Liquid B were mixed with stirring for 30 minutes, and then passed through a column filled with an ion exchange resin to give a palladium sulfide sol.

<Preparation of Physical Development Nuclei Layer Coating Liquid> for Each 1 m²

| Palladium sulfide sol prepared above | 0.4 mg |
| --- | --- |
| 2% (by mass) aqueous solution of glyoxal | 0.2 ml |
| Surfactant (S-1) represented by formula (1) below | 4 mg |
| Denacol EX-830 (polyethylene glycol diglycidyl ether available from Nagase ChemteX Corporation) | 50 mg |
| 10% (by mass) aqueous solution of SP-200 (polyethylenimine available from Nippon Shokubai Co., Ltd.; average molecular weight of 10,000) | 0.5 mg |

[Chem. 1]

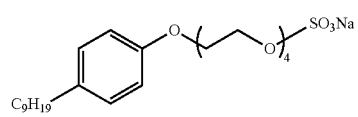

(1)

Subsequently, an intermediate layer, a silver halide emulsion layer, and a protective layer (their compositions are shown below) were applied, in the order from closest to the optically transparent support, to the physical development nuclei layer, and dried to give a silver halide photosensitive material. The silver halide emulsion was produced by a double jet mixing method commonly used for photographic silver halide emulsions. The silver halide emulsion was prepared using 95 mol % of silver chloride and 5 mol % of silver bromide to have an average particle diameter of 0.15 μm. The thus-obtained silver halide emulsion was subjected to gold-sulfur sensitization using sodium thiosulfate and chloroauric acid according to the usual method. The thus-obtained silver halide emulsion contains 0.5 g of gelatin per gram of silver.

<Composition of Intermediate Layer (per m²)>

| Gelatin | 0.5 g |
| --- | --- |
| Surfactant (S-1) represented by formula (1) above | 5 mg |
| Dye 1 represented by formula (2) below | 5 mg |

[Chem. 2]

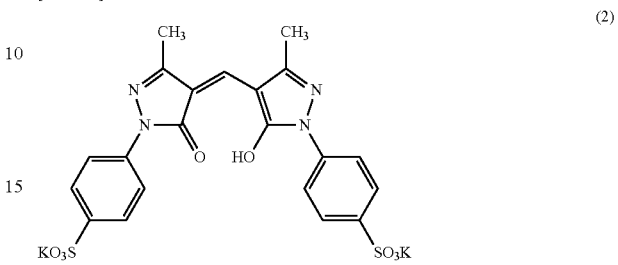

(2)

<Composition of Silver Halide Emulsion Layer (per m²)>

| Gelatin | 0.5 g |
| --- | --- |
| Silver halide emulsion | 3.0 g in silver equivalent |
| 1-Phenyl-5-mercaptotetrazole | 3 mg |
| Surfactant (S-1) represented by formula (1) above | 20 mg |

<Composition of Protective Layer (per m²)>

| Gelatin | 1 g |
| --- | --- |
| Amorphous silica matting agent (average particle size: 3.5 μm) | 10 mg |
| Surfactant (S-1) represented by formula (1) above | 10 mg |

The thus-obtained silver halide photosensitive material was brought into close contact with a transparent manuscript having a pattern shown in FIG. 1, followed by exposure in a contact printer having a mercury lamp as a light source, through a resin filter that cuts off light of a wavelength of 400 nm or less. The sensor parts 11 are formed from rhombus-shaped unit figures each having a wire width of 5 μm, a major diagonal length of 555.56 μm, a minor diagonal length of 357.14 μm (one vertex has an angle of 75°). The minor diagonal length corresponds to the period (Py) of the unit figure in the y-direction, and the minor diagonal length is 1/28 of twice the length of the period L (4.99996 mm) of the sensor part in FIG. 1. In addition, the major diagonal length corresponds to the period (Px) of the unit figure in the x-direction, and the major diagonal length is 1/18 of twice the length of the period M (5.00004 mm) of the sensor part in FIG. 1. The dummy parts 12 and the sensor parts 11 are formed from the same rhombus-shaped unit figures. Yet, as shown in FIG. 2, each of the rhombuses 22a to 22h sharing one or more vertices with the rhombus 21 having no disconnection part has disconnection parts. The rhombuses 22a, 22c, 22e, and 22g each have four disconnection parts, and the rhombuses 22b, 22d, 22f, and 22h each have two disconnection parts. Other disconnection parts that are present, including those overlying the imaginary boundary line a, are as shown in FIG. 2. The disconnection width (C in FIG. 2) in the disconnection part of each rhombus is 7 μm. In the pattern shown in FIG. 2, the percentage of the region satisfying the requirement (1) of the present invention is 89.7%.

Subsequently, after immersion in a diffusion transfer developer (described below) at 20° C. for 60 seconds, the silver halide emulsion layer, the intermediate layer, and the protective layer were washed off with warm water at 40° C., followed by drying. Thus, an optically transparent conductive material 1 having a pattern that is a mirror image to the pattern of the transparent manuscript in FIG. 1 was obtained. The properties such as wire width and wire interval of the obtained optically transparent conductive material 1 were exactly the same as those in the pattern on the transparent manuscript. The thickness of the obtained pattern was 0.1 µm as measured with a confocal microscopy.

<Composition of Diffusion Transfer Developer>

| | |
|---|---:|
| Potassium hydroxide | 25 g |
| Hydroquinone | 18 g |
| 1-Phenyl-3-pyrazolidone | 2 g |
| Potassium sulfite | 80 g |
| N-methylethanolamine | 15 g |
| Potassium bromide | 1.2 g |

The total volume was made up to 1000 ml with water.
The pH was adjusted to 12.2.

<Production of Optically Transparent Conductive Material 2>

An optically transparent conductive material 2 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 3. The properties such as wire width and wire interval of the obtained optically transparent conductive material 2 are the same as those of the transparent manuscript, and the disconnection width in each disconnection part of each rhombus is 7 µm. The percentage of the region satisfying the requirement (2) of the present invention in the dummy part is 81.0%.

<Production of Optically Transparent Conductive Material 3>

Figure 4:
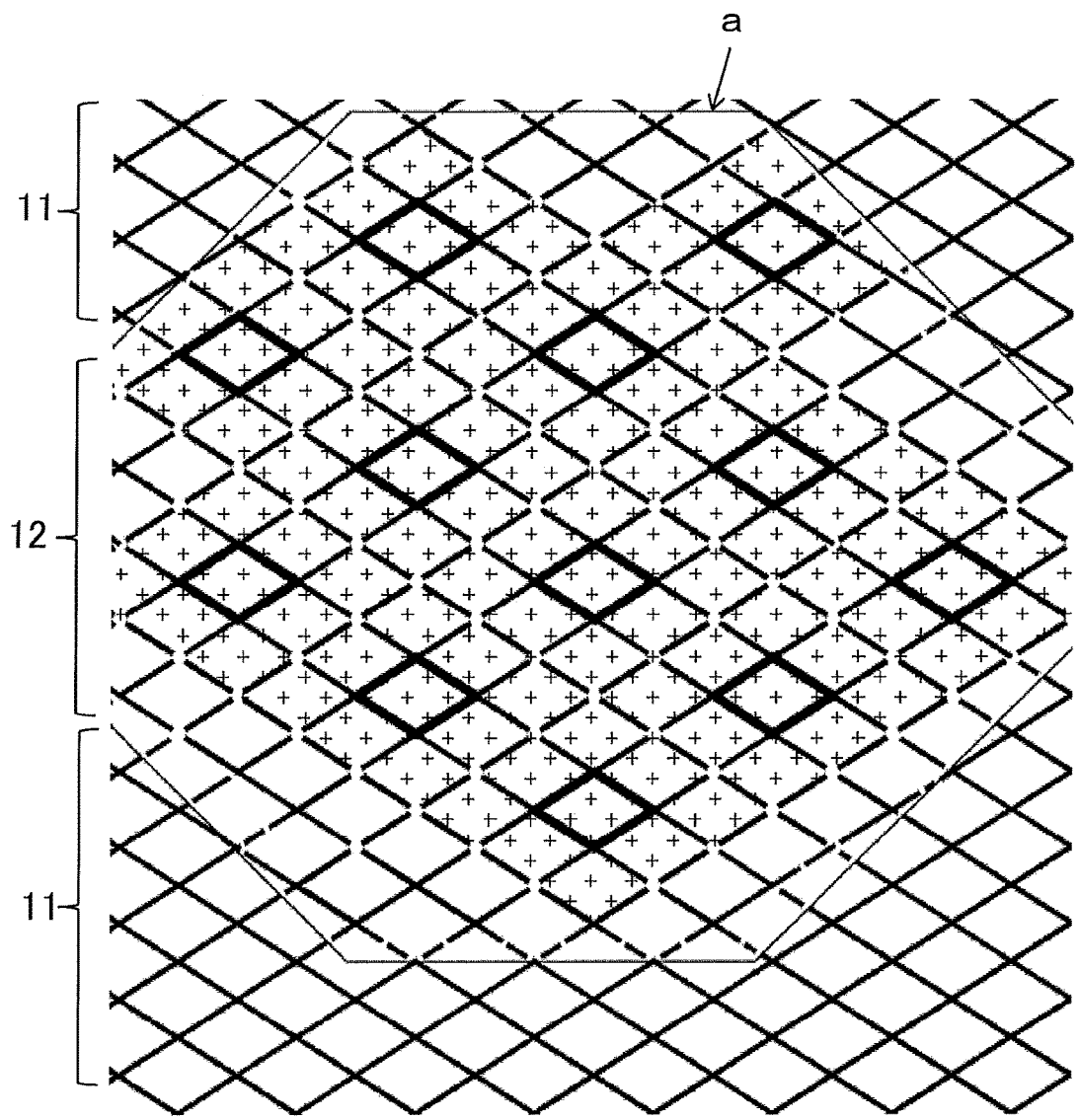
FIG. 4 is a view of a transparent manuscript used in an example.

An optically transparent conductive material 3 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 4. The properties such as wire width and wire interval of the obtained optically transparent conductive material 3 are the same as those of the transparent manuscript, and the disconnection width in each disconnection part of each rhombus is 7 µm. The percentage of the region satisfying the requirement (1) of the present invention in the dummy part is 69.4%.

<Production of Optically Transparent Conductive Material 4>

Figure 5:
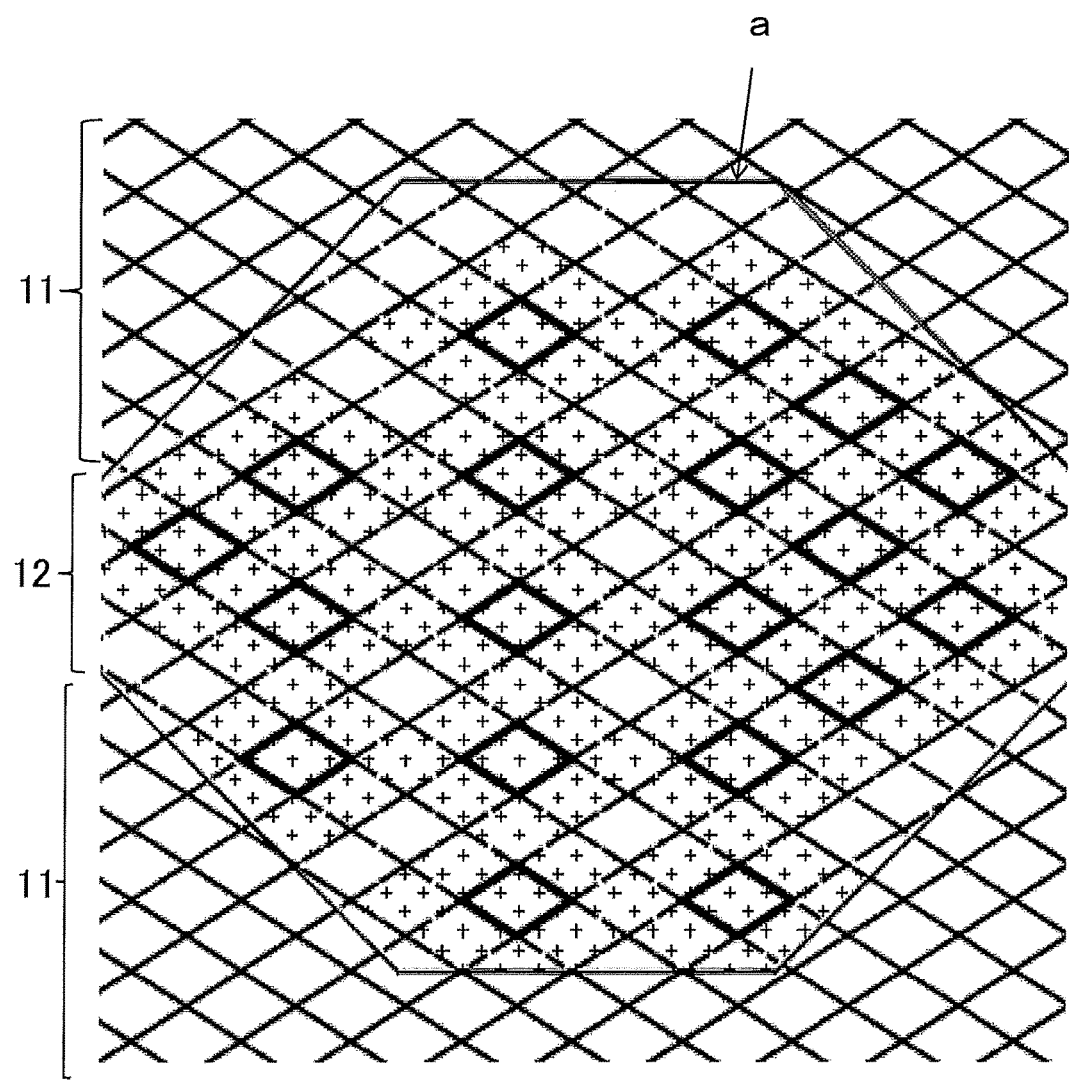
FIG. 5 is a view of a transparent manuscript used in an example.

An optically transparent conductive material 4 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 5. The properties such as wire width and wire interval of the obtained optically transparent conductive material 4 are the same as those of the transparent manuscript, and the disconnection width in each disconnection part of each rhombus is 7 µm. The percentage of the region satisfying the requirement (1) of the present invention in the dummy part is 77.7%.

<Production of Optically Transparent Conductive Material 5>

Figure 6:
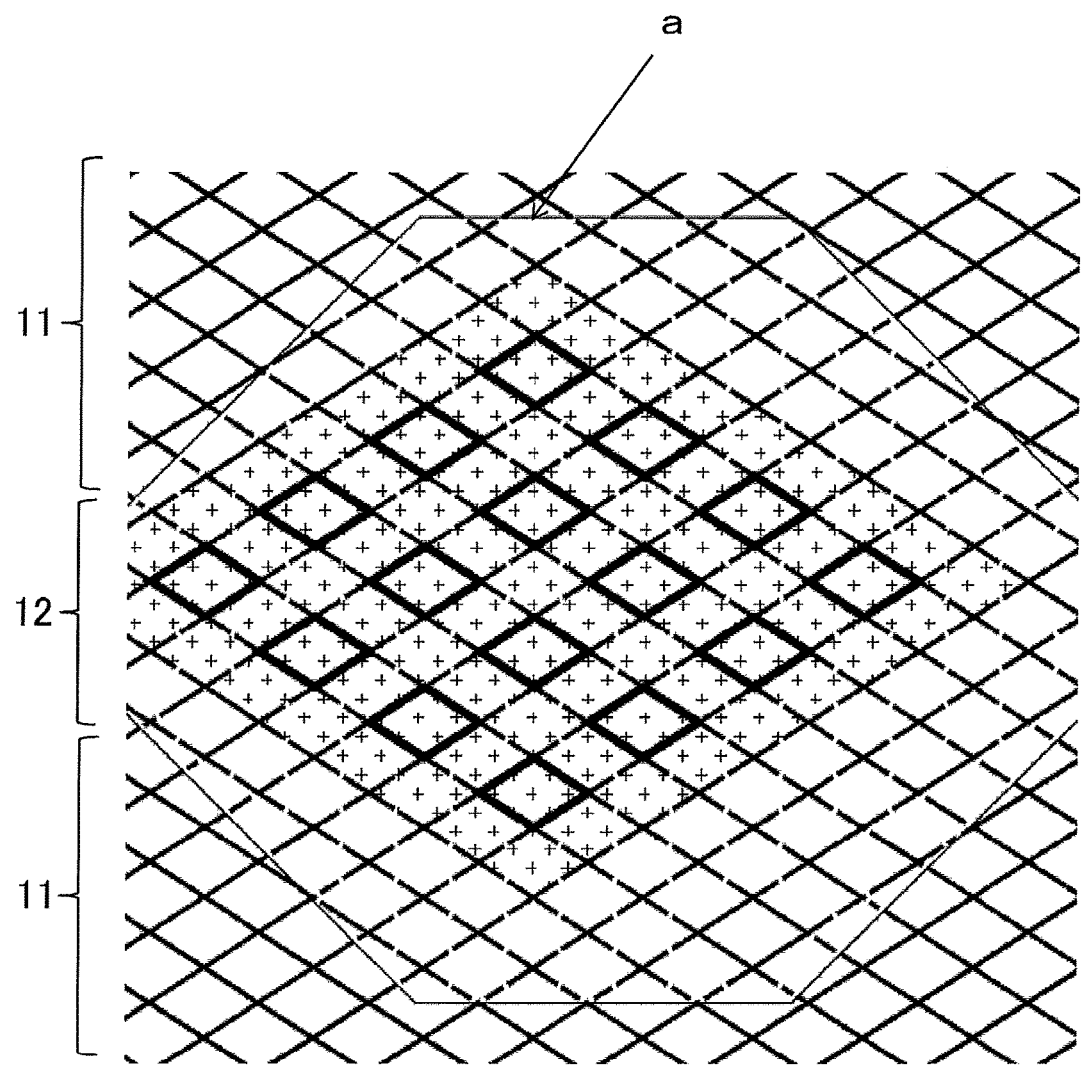
FIG. 6 is a view of a transparent manuscript used in an example.

An optically transparent conductive material 5 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 6. The properties such as wire width and wire interval of the obtained optically transparent conductive material 5 are the same as those of the transparent manuscript, and the disconnection width in each disconnection part of each rhombus is 7 µm. The percentage of the region satisfying the requirement (1) of the present invention in the dummy part is 52.5%.

<Production of Optically Transparent Conductive Material 6>

Figure 7:
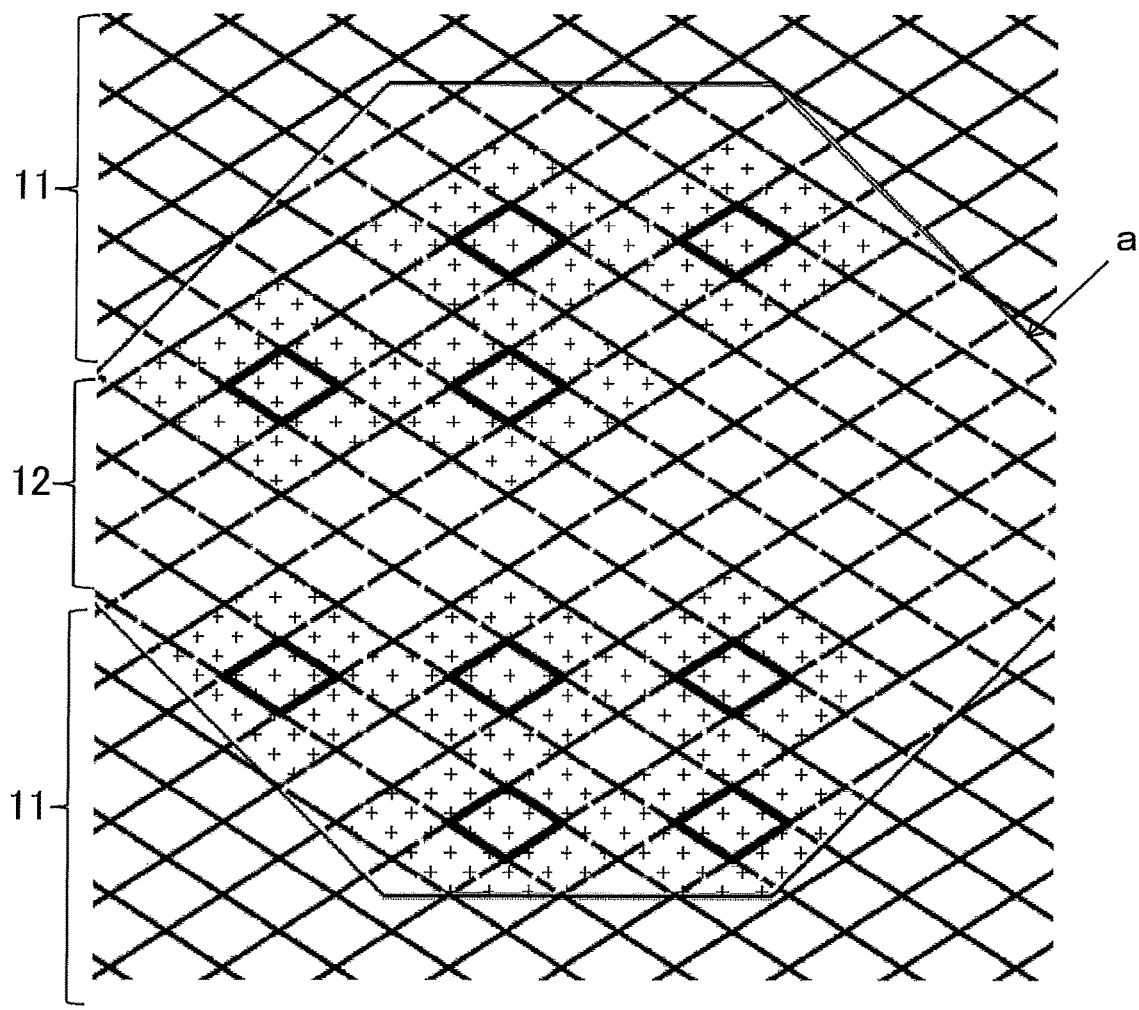
FIG. 7 is a view of a transparent manuscript used in an example.

An optically transparent conductive material 6 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 7. The properties such as wire width and wire interval of the obtained optically transparent conductive material 6 are the same as those of the transparent manuscript, and the disconnection width in each disconnection part of each rhombus is 7 µm. The percentage of the region satisfying the requirement (1) of the present invention in the dummy part is 46.6%.

<Production of Optically Transparent Conductive Material 7>

Figure 8:
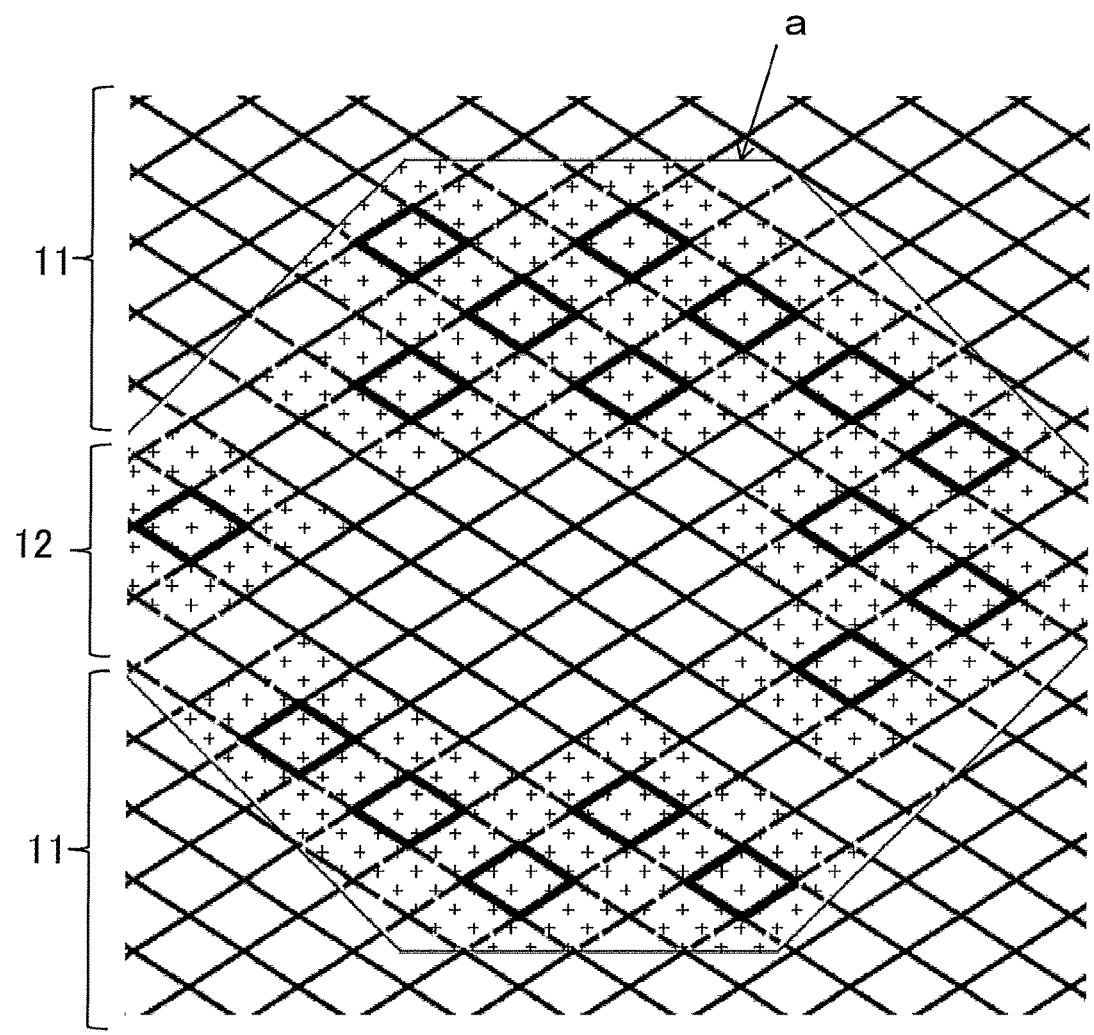
FIG. 8 is a view of a transparent manuscript used in an example.

An optically transparent conductive material 7 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 8. The properties such as wire width and wire interval of the obtained optically transparent conductive material 7 are the same as those of the transparent manuscript, and the disconnection width in each disconnection part of each rhombus is 7 µm. The percentage of the region satisfying the requirement (1) of the present invention in the dummy part is 67.4%.

<Production of Optically Transparent Conductive Material 8>

Figure 9:
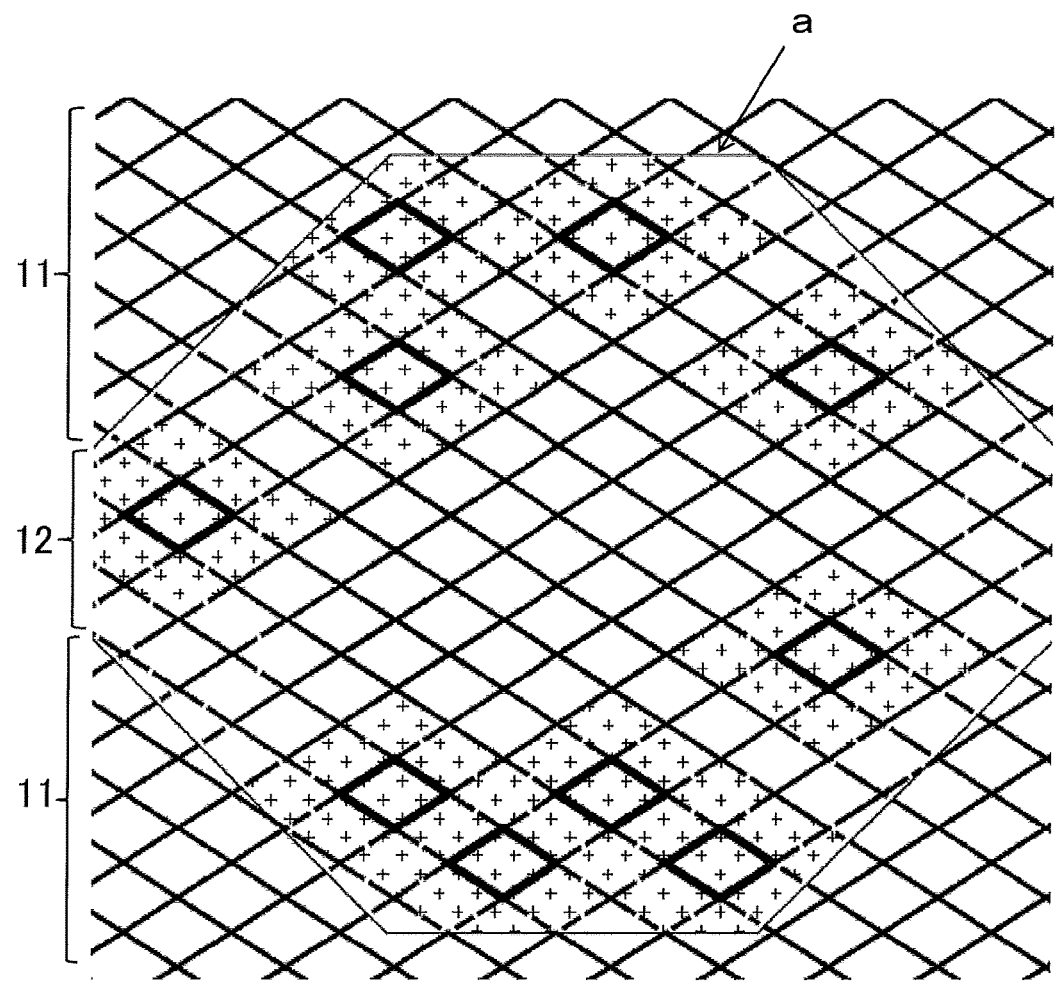
FIG. 9 is a view of a transparent manuscript used in an example.

An optically transparent conductive material 8 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 9. The properties such as wire width and wire interval of the obtained optically transparent conductive material 8 are the same as those of the transparent manuscript, and the disconnection width in each disconnection part of each rhombus is 7 µm. The percentage of the region satisfying the requirement (1) of the present invention in the dummy part is 48.9%.

<Production of Optically Transparent Conductive Material 9>

An optically transparent conductive material 9 was obtained in the same manner as in the production of the optically transparent conductive material 1, except for using a transparent manuscript having the pattern shown in FIG. 1 with the dummy parts 12 having a thin wire pattern shown in FIG. 2 and with a disconnection part having a disconnection width of 7 μm provided at the midpoint of each side of each rhombus in the dummy parts. The properties such as wire width and wire interval of the obtained optically transparent conductive material 9 are the same as those of the transparent manuscript. The percentage of the region satisfying the requirement (1) or (2) of the present invention in the dummy part is 0%.

<Production of Optically Transparent Conductive Material 10>

Figure 10:
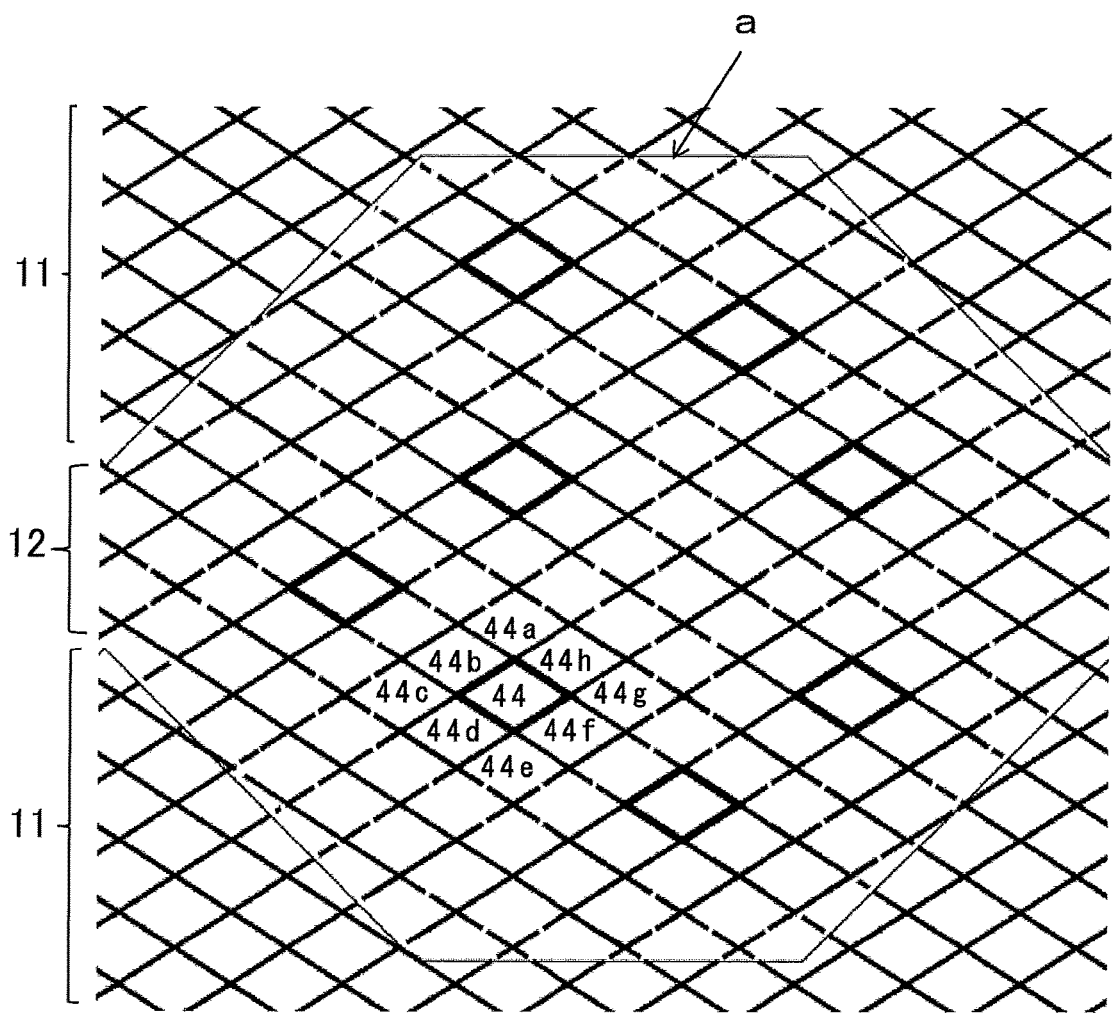
FIG. 10 is a view of a transparent manuscript used in an example.

An optically transparent conductive material 10 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part and are each equivalent to a rhombus 44 described below) shown in FIG. 10. In FIG. 10, the rhombus 44 has no disconnection part. Among the rhombuses 44a to 44h sharing one or more vertices with the rhombus 44, the rhombuses 44b, 44d, 44f, and 44h have no disconnection part. The properties such as wire width and wire interval of the obtained optically transparent conductive material 10 are the same as those of the transparent manuscript, and the disconnection width in each disconnection part of each of the rhombuses 44a, 44c, 44e, and 44g is 7 μm. The percentage of the region satisfying the requirement (1) or (2) in the dummy part is 0%.

<Production of Optically Transparent Conductive Material 11>

Figure 11:
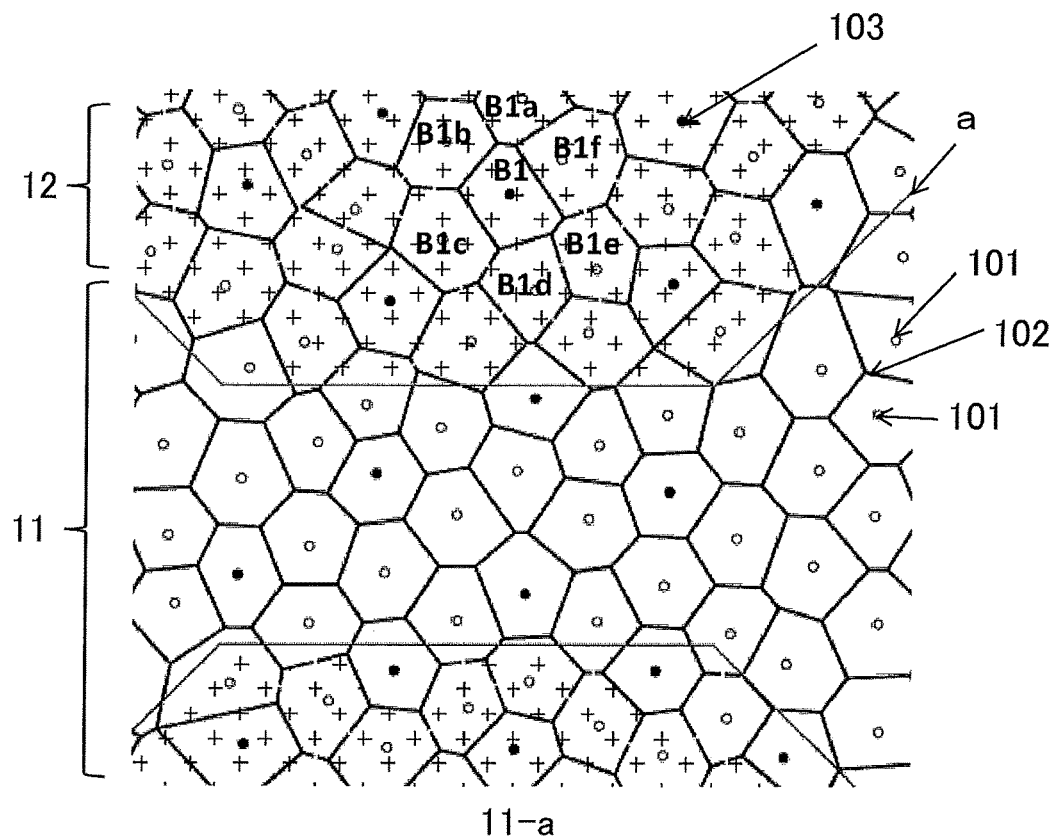
FIG. 11 is a view of a transparent manuscript used in an example.
Figure 11:
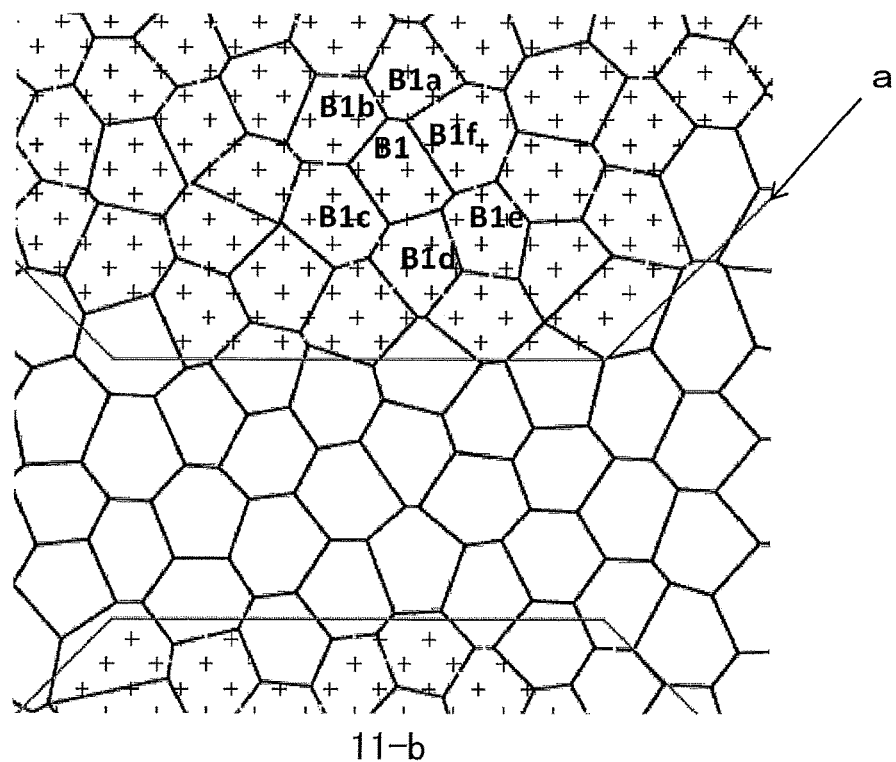

A transparent manuscript having the pattern shown in FIG. 1 with the sensor parts 11 and the dummy parts 12 having a thin wire pattern of a Voronoi diagram shown in 11-b of FIG. 11 was used. In this Voronoi diagram, each of polygons B1*a* to B1*f* sharing vertices with a polygon B1 having no disconnection part has four disconnection parts. The disconnection width in each disconnection part is 7 μm, and the wire width of each Voronoi segment is 5 μm. In addition, while the period L of the sensor part in FIG. 1 is 4.99996 mm as described above, the base figures in 11-b are not arranged with the period (By) in the y-direction. An optically transparent conductive material 11 was produced in the same manner as in the production of the optically transparent conductive material 1, except for using the transparent manuscript described above. The properties such as wire width and wire interval of the obtained optically transparent conductive material 11 are the same as those of the transparent manuscript. The percentage of the region satisfying the requirement (1) of the present invention in the dummy part is 92.3%.

<Production Method of Thin Wire Pattern of a Voronoi Diagram>

A plane is covered with the rhombuses shown in FIG. 2 (each rhombus has a major diagonal length (diagonal length in the Y-direction) of 555.56 μm and a minor diagonal length of 357.14 μm), and one point is randomly located in each rhombus (points 101 in 11-a of FIG. 11). Next, a region closest to any one point 101 and a region closest to another point 101 adjacent to the former point 101 are divided by a boundary line (by a perpendicular bisector connecting the point 101 and its adjacent point 101) to draw a Voronoi segment 102. Thus, a thin wire pattern was produced. In addition, the Voronoi diagram was provided with disconnection parts by a disconnection part production method described below.

<Disconnection Part Production Method>

A plane is covered with the rhombuses shown in FIG. 2, and one point 101 is randomly located in each rhombus. Next, some points 101 are selected with an interval of one point between two points in such a manner that the point in any one rhombus and the point in another rhombus sharing a side with the former rhombus are not consecutive. The thus-selected points are points 103 indicated with black dots in 11-a of FIG. 11. No disconnection parts were provided in each polygon B1 obtained by Voronoi segments surrounding the point 103. A disconnection part was provided at the midpoint of each side not shared with the polygon B1 among all the sides of the polygons B1*a* to B1*f* sharing vertices with the polygon B1. No disconnection parts were provided on Voronoi segments located inside the sensor parts 11. Disconnection parts were provided on the boundary (on the imaginary boundary line a) between the sensor part 11 and the dummy part 12.

<Production of Optically Transparent Conductive Material 12>

Figure 12:
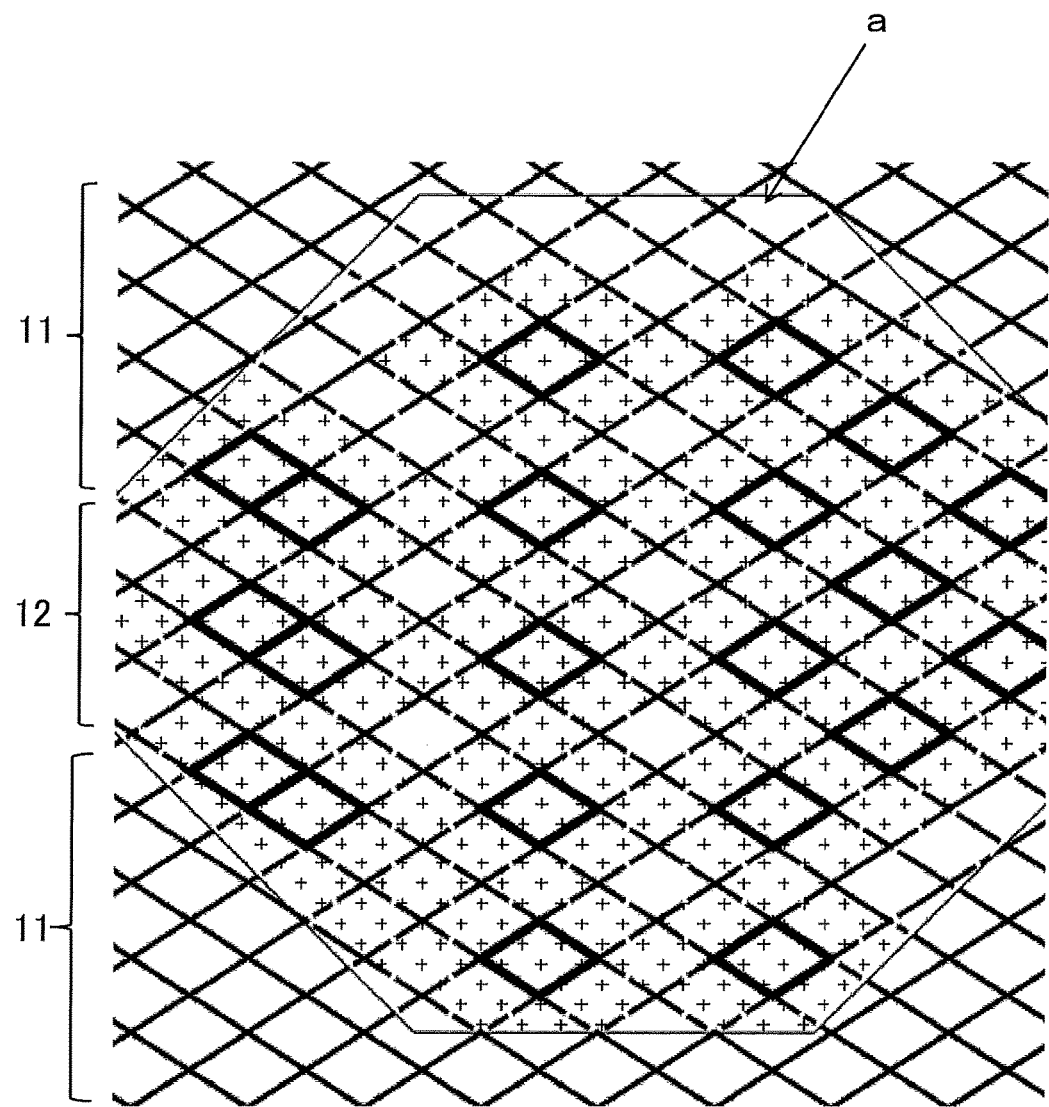
FIG. 12 is a view of a transparent manuscript used in an example.

An optically transparent conductive material 12 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 12. The properties such as wire width and wire interval of the obtained optically transparent conductive material 12 are the same as those of the transparent manuscript. The percentage of the region satisfying the requirement (1) and the region satisfying the requirement (2) of the present invention in the dummy part is 84.5%.

The dummy part 12 shown in FIG. 12 includes polygons satisfying both the requirement (1) and the requirement (2). These polygons were counted as belonging to the region satisfying the requirement (1).

<Production of Optically Transparent Conductive Material 13>

An optically transparent conductive material 13 was obtained in the same manner as in the production of the optically transparent conductive material 1, except for using a transparent manuscript having the pattern shown in FIG. 1 with the dummy parts 12 having a thin wire pattern (thick-lined rhombuses have no disconnection part) shown in FIG. 13. The properties such as wire width and wire interval of the obtained optically transparent conductive material 13 are the same as those of the transparent manuscript. The percentage of the region satisfying the requirement (2) in the dummy part is 74.3%.

The obtained optically transparent conductive materials 1 to 13 were tested as described below to evaluate the pattern visibility, short circuit, and capacitance. Table 1 shows the results.

<Evaluation of Pattern Visibility>

In a room protected from external light, each obtained optically transparent conductive material was placed with its side having a metal thin wire pattern facing up, and irradiated from above with a three-wavelength fluorescent lamp located 30 cm away from the table. The optically transparent conductive material was observed from an angle of 30° relative to the table surface to determine whether or not the shapes of the sensor parts and the dummy parts are visible. The evaluation was made based on the following criteria: "1" for a level at which the sensor parts and the dummy parts are visible when observed from a position 100 cm away from the side of the optically transparent conductive material (poor: the pattern is visible from afar); "2" for a level at which the sensor parts and the dummy parts are visible when observed from a position 50 cm away from the side of the optically transparent conductive material (inadequate: the pattern is visible); "3" for a level at which the sensor parts and the dummy parts are visible when observed from a position 20 cm away from the side of the optically transparent conductive material (good: the pattern is only slightly visible at a close range); and "4" for a level at which the sensor parts and the dummy parts are not visible when observed from a position 20 cm away from the side of the optically transparent conductive material (excellent: the pattern is not visible even at a close range).

<Evaluation of Short Circuit>

In the production of the optically transparent conductive materials 1 to 13, 100 sheets of each optically transparent conductive material were produced. The evaluation was made based on the percentage of sheets in which a circuit between the right and left terminal areas 15 was shorted to its adjacent circuit, which are electrically connected in the pattern shown in FIG. 1.

<Measurement of Capacitance>

Figure 14:
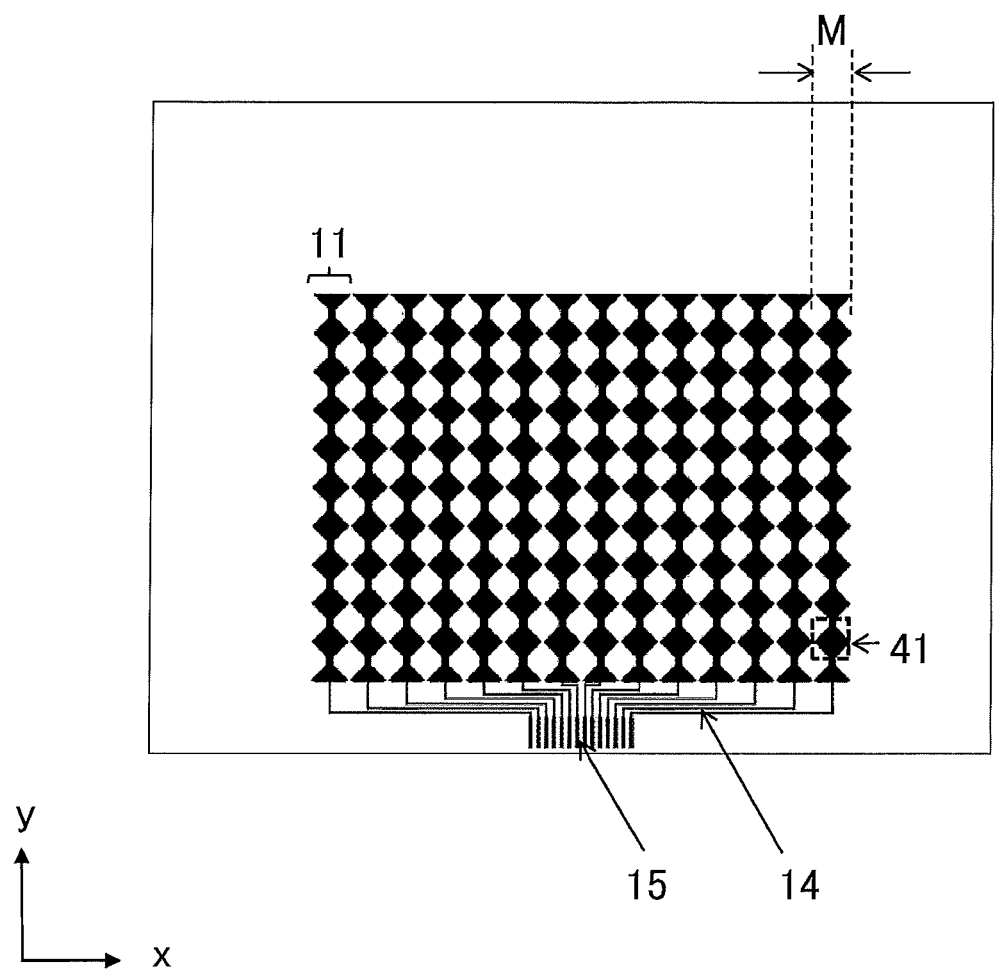
FIG. 14 is a view of a transparent manuscript used in an example.

An optically transparent conductive material including sensor parts extending in a y-direction was obtained in the same manner as in the production of the optically transparent conductive material 1, except for using a transparent manuscript having a pattern shown in FIG. 14. In FIG. 14, the sensor parts 11 extend in the y-direction and are arranged with a period of 4.99996 mm (which corresponds to M in FIG. 14) in an x-direction. Each sensor part has a pattern in which diamond shapes 41 are arranged with a period of 5.00004 mm in the y-direction and are linearly connected. In addition, the sensor parts 11 have a solid pattern (unlike a net-like pattern, a solid pattern includes completely solid wires), and there is no wire between one sensor part 11 and its adjacent sensor part 11. The sensor parts 11 are each electrically connected to the terminal areas 15 via respective peripheral wiring parts 14. OCA (MHM-FWD175) available from Nichiei Kakoh Co., Ltd. was pasted to a metal pattern side of the obtained optically transparent conductive material including the sensor parts extending in the y-direction. Subsequently, the OCA-pasted side of the optically transparent conductive material including the sensor parts extending in the y-direction was pasted to an optically transparent support side of each of the optically transparent conductive materials 1 to 13 including the sensor parts extending in the x-direction in such a manner that the regions of the sensor parts 11 of the optically transparent conductive material including the sensor parts extending in the y-direction are perfectly superimposed on the regions of the dummy parts 12 of each of the optically transparent conductive materials 1 to 13 in a projection view. Thus, conductive material laminates were produced.

Ten sets of the conductive material laminates were produced for each of the optically transparent conductive materials 1 to 13.

For pasting, the optically transparent conductive material including the sensor parts extending in the y-direction and the optically transparent conductive materials 1 to 13 were partially cut before pasting so as to expose the terminal areas 15 of these optically transparent conductive materials. For each of the obtained laminates, the capacitance between all the terminal areas 15 of the optically transparent conductive material including the sensor parts extending in the y-direction and all the terminal areas 15 of each of the optically transparent conductive materials 1 to 13 was measured using an L/C meter (U1731C available from Agilent), and an average value was determined. A lower average value indicates a higher sensitive touchscreen.

TABLE 1

| Optically transparent conductive material | Percentage of the region(s) satisfying the requirement (1) and/or the requirement (2) | Evaluation of pattern visibility | Evaluation of short circuit | Average capacitance |
|---|---|---|---|---|
| 1 | 89.7% | 4 | 0% | 10 pF |
| 2 | 81.0% | 4 | 0% | 10 pF |
| 3 | 69.4% | 4 | 5% | 10 pF |
| 4 | 77.7% | 4 | 0% | 10 pF |
| 5 | 52.5% | 4 | 0% | 10 pF |
| 6 | 46.6% | 3 | 1% | 10 pF |
| 7 | 67.4% | 4 | 0% | 10 pF |
| 8 | 48.9% | 3 | 1% | 12 pF |
| 9 | 0% | 1 | 0% | 10 pF |
| 10 | 0% | 2 | 10% | 15 pF |
| 11 | 92.3% | 4 | 0% | 10 pF |
| 12 | 84.5% | 4 | 0% | 10 pF |
| 13 | 74.3% | 4 | 0% | 10 pF |

Table 1 confirms that the pattern is hardly visible in the optically transparent conductive materials 1 to 8 and 11 to 13 including the regions satisfying the requirement (1) and/or the regions satisfying the requirement (2) of the present invention. The results clearly show the effects of the present invention.

REFERENCE SIGNS LIST 1 optically transparent conductive material
2 optically transparent support
11 sensor part
12 dummy part
13 non-image part
14 peripheral wiring part
15 terminal area
21, 22a to 22h, 24, 25a to 25h, 31, 32, 33a to 33j, 35, 36, 37a to 37j, 51, 52, 53a to 53l rhombus B1, B1a to B1f polygon
41 diamond shape
a imaginary boundary line L, M period

The invention claimed is:

1. An optically transparent conductive material comprising:
   an optically transparent support;
   sensor parts electrically connected to terminal areas via peripheral wiring parts; and
   dummy parts not electrically connected to the terminal areas, the sensor parts and the dummy parts being disposed on the optically transparent support,
   wherein the sensor parts and the dummy parts each have a metal thin wire net-like pattern formed by an assembly of multiple polygons,
   wherein the metal thin wire pattern of each dummy part includes disconnection parts, and
   wherein the metal thin wire pattern of each dummy part also includes:
   a region satisfying the requirement that each polygon sharing one or more vertices with a polygon having no disconnection part includes at least one disconnection part; and/or
   a region satisfying the requirement that each polygon sharing one or more vertices with at least one of two polygons sharing a side or a vertex and having no disconnection part includes at least one disconnection part.

* * * * *